(12) United States Patent
Xie et al.

(10) Patent No.: US 11,621,162 B2
(45) Date of Patent: Apr. 4, 2023

(54) SYSTEMS AND METHODS FOR FORMING UV-CURED LOW-κ DIELECTRIC FILMS

(71) Applicant: Applied Materials, Inc., Santa Clara, CA (US)

(72) Inventors: Bo Xie, San Jose, CA (US); Ruitong Xiong, Santa Clara, CA (US); Sure Ngo, Dublin, CA (US); Kang Sub Yim, Palo Alto, CA (US); Yijun Liu, Santa Clara, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/063,358

(22) Filed: Oct. 5, 2020

(65) Prior Publication Data

US 2022/0108884 A1    Apr. 7, 2022

(51) Int. Cl.
*H01L 21/02* (2006.01)

(52) U.S. Cl.
CPC .. *H01L 21/02348* (2013.01); *H01L 21/02167* (2013.01); *H01L 21/02208* (2013.01); *H01L 21/02274* (2013.01)

(58) Field of Classification Search
CPC ......... H01L 21/02348; H01L 21/02167; H01L 21/02208; H01L 21/02274
See application file for complete search history.

(56) References Cited

U.S. PATENT DOCUMENTS

| 5,989,998 A | 11/1999 | Sugahara et al. |
| 2002/0098684 A1* | 7/2002 | Li ..................... H01L 21/02126 438/630 |
| 2006/0127683 A1 | 6/2006 | Hara et al. |

(Continued)

FOREIGN PATENT DOCUMENTS

KR    2017-0000106 U    1/2017

OTHER PUBLICATIONS

International Search Report and Written Opinion dated Jan. 21, 2022 in International Patent Application No. PCT/US2021/053367, 9 pages.

*Primary Examiner* — Monica D Harrison
*Assistant Examiner* — Andre C Stevenson
(74) *Attorney, Agent, or Firm* — Kilpatrick Townsend & Stockton LLP

(57) ABSTRACT

Semiconductor processing methods are described for forming UV-treated, low-κ dielectric films. The methods may include flowing deposition precursors into a substrate processing region of a semiconductor processing chamber. The deposition precursors may include a silicon-and-carbon-containing precursor. The methods may further include generating a deposition plasma from the deposition precursors within the substrate processing region, and depositing a silicon-and-carbon-containing material on the substrate from plasma effluents of the deposition plasma. The as-deposited silicon-and-carbon-containing material may be characterized by greater than or about 5% hydrocarbon groups. The methods may still further include exposing the (Continued)

deposited silicon-and-carbon-containing material to ultraviolet light. The exposed silicon-and-carbon-containing material may be characterized by less than or about 2% hydrocarbon groups.

20 Claims, 3 Drawing Sheets

(56) References Cited

U.S. PATENT DOCUMENTS

| | | |
|---|---|---|
| 2010/0052115 A1 | 3/2010 | McAndrew et al. |
| 2012/0121823 A1 | 5/2012 | Chhabra et al. |
| 2020/0247830 A1* | 8/2020 | Lei .................. C23C 16/345 |

* cited by examiner

SYSTEMS AND METHODS FOR FORMING UV-CURED LOW-κ DIELECTRIC FILMS

TECHNICAL FIELD

The present technology relates to deposition processes and chambers. More specifically, the present technology relates to methods of producing low-κ films utilizing UV treatments.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Embodiments of the present technology include semiconductor processing methods to form dielectric films with a low dielectric constant (i.e., low-κ) relative to silicon dioxide (κ=3.9). Embodiments of the dielectric films include carbon-containing silicon-oxide films having a dielectric constant (i.e., κ value) less than or about 2.6. In embodiments of the processing methods, these UV-treated, low-κ, carbon-containing dielectric films may be formed as electrically-insulating dielectric layers between metal lines and contacts in back-end-of-line (BEOL) semiconductor fabrication processes. The low κ values of these carbon-containing silicon-oxide films may reduce RC delays in signal propagation, crosstalk noise, and power dissipation in the metal lines and contacts that are separated by the low-κ films.

Embodiments of the semiconductor processing methods may include flowing deposition precursors into a substrate processing region of a semiconductor processing chamber. The deposition precursors may include a silicon-and-carbon-containing precursor. The methods may further include generating a deposition plasma in the substrate processing region from the deposition precursors. A silicon-and-carbon-containing material may be deposited on the substrate from plasma effluents of the deposition plasma. The as-deposited silicon-and-carbon-containing material may be characterized by greater than or about 5% hydrocarbon groups as represented by the FTIR peak area ratio for the constituents of the material. The methods may include exposing the deposited silicon-and-carbon-containing material to ultraviolet light. The exposed silicon-and-carbon-containing material may be characterized by less than or about 2% hydrocarbon groups.

In additional embodiments, the hydrocarbon groups may comprise —$C_xH_y$, where x is an integer greater than or about 1, and y is an integer greater than or about 2. In still further embodiments, the silicon-containing precursor may be characterized by Formula 1:

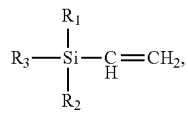

where $R_1$, $R_2$, and $R_3$, may include a $C_1$-$C_6$ alkyl group, or a $C_1$-$C_6$ alkoxy group, and where at least one of $R_1$, $R_2$, and $R_3$, is an alkoxy group. In still further embodiments, the as-deposited silicon-and-carbon-containing material may be characterized by a carbon content greater than or about 20 at. %, and the exposed silicon-and-carbon-containing material may be characterized by a carbon content less than or about 15 at. %. In yet further embodiments, the exposed silicon-and-carbon-containing material may be characterized by methyl incorporation greater than 2.5% as represented by the FTIR peak area ratio for the constituents of the material. In still additional embodiments, the exposed silicon-and-carbon containing material may be characterized by a porosity of greater than or about 15 vol. %. In yet additional embodiments, the exposed silicon-and-carbon containing material may be characterized by a dielectric constant (κ value) less than or about 2.6. In further embodiments, the exposed silicon-and-carbon-containing material may be characterized by a Young's modulus of greater than or about 10 GPa. In yet further embodiments, the exposed silicon-and-carbon-containing material may be characterized by a hardness of greater than or about 2 GPa.

Embodiments of the present technology may include additional methods to form UV-cured low-κ dielectric films. Embodiments of the methods may include flowing deposition precursors into a substrate processing region of a semiconductor processing chamber. In embodiments, the deposition precursors may include a silicon-carbon-and-oxygen-containing precursor. Embodiments of the method may further include generating a deposition plasma from the deposition precursors within the substrate processing region. The semiconductor processing chamber may be characterized by a temperature greater than or about 300° C. during the generation of the deposition plasma and deposition of plasma effluents on a substrate in the semiconductor processing chamber. The methods may further include exposing the as-deposited silicon-carbon-and-oxygen-containing material to ultraviolet (UV) light. The exposed silicon-carbon-and-oxygen-containing material may be characterized by a dielectric constant less than or about 2.6.

In additional embodiments, the as-deposited silicon-carbon-and-oxygen-containing material may be characterized by greater than or about 5% hydrocarbon groups, and the exposed silicon-carbon-and-oxygen-containing material may be characterized by less than or about 2% hydrocarbon groups. In yet additional embodiments, the as-deposited silicon-carbon-and-oxygen-containing material may be characterized by a methyl incorporation less than or about 4%, and the exposed silicon-carbon-and-oxygen-containing material may be characterized by a methyl incorporation of greater than or about 3.5%. In further embodiments, the silicon-carbon-and-oxygen-containing precursor my include at least one vinyl group. In still further embodiments, the as-deposited silicon-carbon-and-oxygen-containing material is characterized by a porosity of less than or about 10 vol. %. In yet further embodiments, the exposed silicon-carbon-and-oxygen-containing material may be characterized by a Young's modulus of greater than or about 10 GPa, and may be further characterized by a hardness of greater than or about 2 GPa.

Embodiments of the present technology may include still further methods to form low-κ dielectric films. Embodiments of the methods may include flowing deposition precursors into a substrate processing region of a semiconductor processing chamber. The deposition precursors may include a silicon-carbon-and-oxygen-containing precursor with at least one vinyl group. The methods may further include depositing a silicon-carbon-and-oxygen-containing material on a substrate in the semiconductor processing chamber. In some embodiments, the as-deposited silicon-carbon-and-oxygen-containing material may be characterized by a porosity of less than or about 10 vol. %. The as-deposited material on the substrate may be exposed to ultraviolet light, and the exposed silicon-carbon-and-oxygen-containing material may be characterized by a porosity of greater than or about 15 vol. %.

In additional embodiments, the as-deposited silicon-carbon-and-oxygen-containing material may be deposited from deposition plasma effluents formed from a deposition plasma generated by the deposition precursors. In still additional embodiments, the exposed silicon-carbon-and-oxygen-containing material may be characterized by a Si—C—Si bonds of greater than or about 0.1% as represented by the FTIR peak area ratio for the constituents of the material. In further embodiments, the exposed silicon-carbon-and-oxygen-containing material may be characterized by a Young's modulus of greater than or about 10 GPa, and a hardness of greater than or about 2 GPa. In still further embodiments, the exposed silicon-carbon-and-oxygen-containing material may be characterized by a methyl incorporation of greater than or about 3.5%. In yet further embodiments, the exposed silicon-carbon-and-oxygen-containing material may be characterized by a dielectric constant less than or about 2.6.

Such technology may provide numerous benefits over conventional processing methods. For example, utilizing silicon-containing precursors that include organic moieties which increase the amount of hydrocarbon groups in the as-deposited material increases the ability of a UV treatment to lower the dielectric constant of the exposed material. The UV light dislodges more of the weakly-bound hydrocarbon groups from the material than the strongly-bound Si—C and Si—O—C carbons. The hydrocarbon groups dislodged by the UV light leave behind pores in the exposed low-κ material that further reduce the dielectric constant (κ value) of the material. In embodiments, the present methods further increase the amount of hydrocarbon groups in the as-deposited material by depositing them at lower substrate temperatures than typical in conventional depositions of low κ materials. In embodiments, the deposition may be conducted at temperatures of less than or about 300° C. to deposit a low-κ material with more hydrocarbon groups left unreacted or partially-reacted in the material. The subsequent exposure to UV light results the removal of more hydrocarbon groups from the material creating an increased pore volume and a reduced dielectric constant (κ value). Because the UV treatment selectively removes the hydrocarbon groups over other carbon groups in the low-κ material, there remains a significant amount of crosslinked carbon in the exposed material that maintains its mechanical stability despite the increase in porosity. Thus, another benefit of the present technology is to form a UV-treated, carbon-containing, low-κ film at low temperature with increased porosity that does not reduce the film's mechanical stability. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
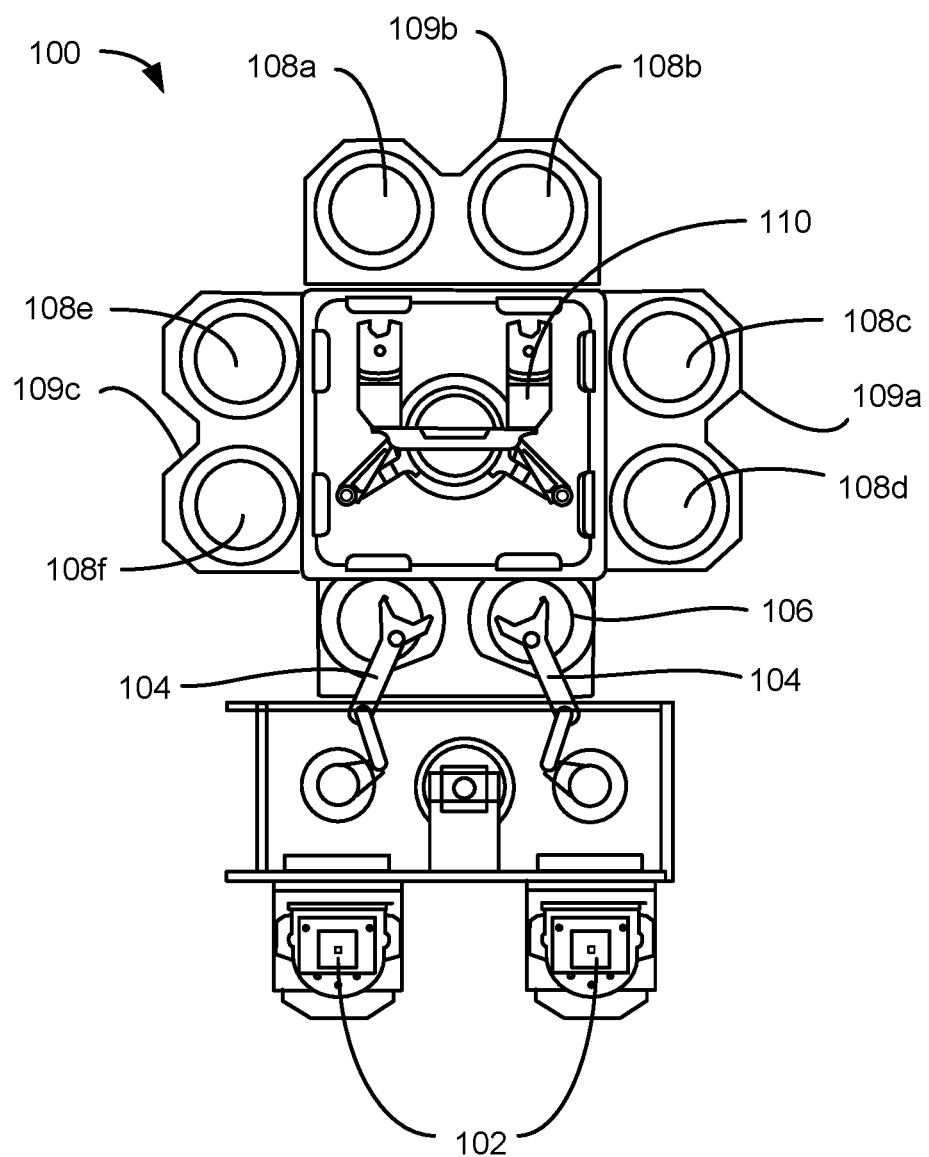
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During back-end-of-line (BEOL) semiconductor processing, low-κ films may serve multiple functions in the fabrication of metallization layers in an integrated circuit. These functions may include the incorporation of electrically-insulating low-κ films between electrically-conductive metal-containing structures such as interconnect lines, contact holes, and vias, among other structures. They may also include the partial removal of a low-κ film following the formation of metal structure. One common removal process in BEOL processing is chemical-mechanical-polishing (CMP) that uses a combination of chemical etching and physical abrasion to remove the low-κ material from a substrate surface.

Low-κ films used in BEOL processing should have a low dielectric constant (κ value) relative to undoped silicon oxide and high mechanical stability to resist fracturing during the formation of metal-containing structures and removal by CMP. Unfortunately, these qualities are often in tension in low-κ films made from a UV-treated silicon-carbon-and-oxygen-containing material. In many instances, the UV treatment increases the porosity of the film, and the increased porosity can reduce the film's mechanical stability. In addition, the increased levels of carbon in the film may both lower the κ value and reduce the film's mechanical stability. The reduction in mechanical stability may be measured by the film having a lower Young's modulus and a lower hardness, among the film's other mechanical characteristics.

One approach to addressing these issues is to replace the UV treatment operation with other types of treatments. In some conventional embodiments, a UV treatment operation is eliminated by depositing the low-κ film at increased deposition temperatures, such as greater than or about 500° C. Unfortunately, these higher deposition temperatures can exceed the thermal budgets of many semiconductor fabrication processes. The higher temperatures can also create unwanted reactions in the depositing low-κ material, such as the reaction of Si—H and oxygen groups to form hydroxyl groups (—OH) in the as-deposited film. Relatively small amounts of hydroxyl groups can significantly increase the dielectric constant of a low-κ film. In further conventional methods, a UV treatment operation is replaced with a plasma treatment following the deposition of the low-κ material. While plasma treatments may be conducted at lower temperatures than high-temperature depositions, they are generally conducted at higher temperatures than UV treatments, such as greater than or about 400° C. These plasma treatment temperatures can put a strain on the thermal budgets of some semiconductor fabrication methods. In addition, conventional plasma treatments of low-κ, carbon-containing films have great difficulty reducing the film's dielectric constant (κ value) below 3.0. For many semiconductor fabrication processes, a dielectric constant for a low-κ film of less than or about 2.6 is desired.

The present technology may overcome these issues by including embodiments of semiconductor processing methods that form UV-treated, low-κ films with good mechanical stability. In embodiments, these low-κ films may be characterized by a low dielectric constant (κ value) of less than or about 2.6. The low dielectric constant may be attributed in part to the UV-related films having a high porosity of greater than or about 15 vol. %. However, embodiments of the present method maintain the mechanical stability of the films despite the high porosity. They may be characterized by a high Young's modulus of greater than or about 10 GPa, and a high hardness of greater than or about 2 GPa.

The present technology includes embodiments of semiconductor processing methods that deposit low-κ materials with increased amounts of weakly-reacted hydrocarbon groups that may be selectively removed by a UV treatment operation compared to carbon crosslinked with silicon and silicon oxide groups. Consequently, the UV treatment operation forms exposed low-κ materials with increased porosities, reduced dielectric constants, and good mechanical stabilities compared to conventional UV treatment operations on as-deposited low-κ materials having fewer hydrocarbon groups.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and UV treatment chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including plasma-enhanced chemical vapor deposition, atomic layer deposition, physical vapor deposition, etch, UV treatments, pre-clean, degas, orientation, and other substrate processes including, annealing, ashing, etc.

The substrate processing chambers 108a-f may include one or more system components for depositing, annealing, UV treating and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and UV treatment chambers for dielectric films are contemplated by system 100.

Figure 2:
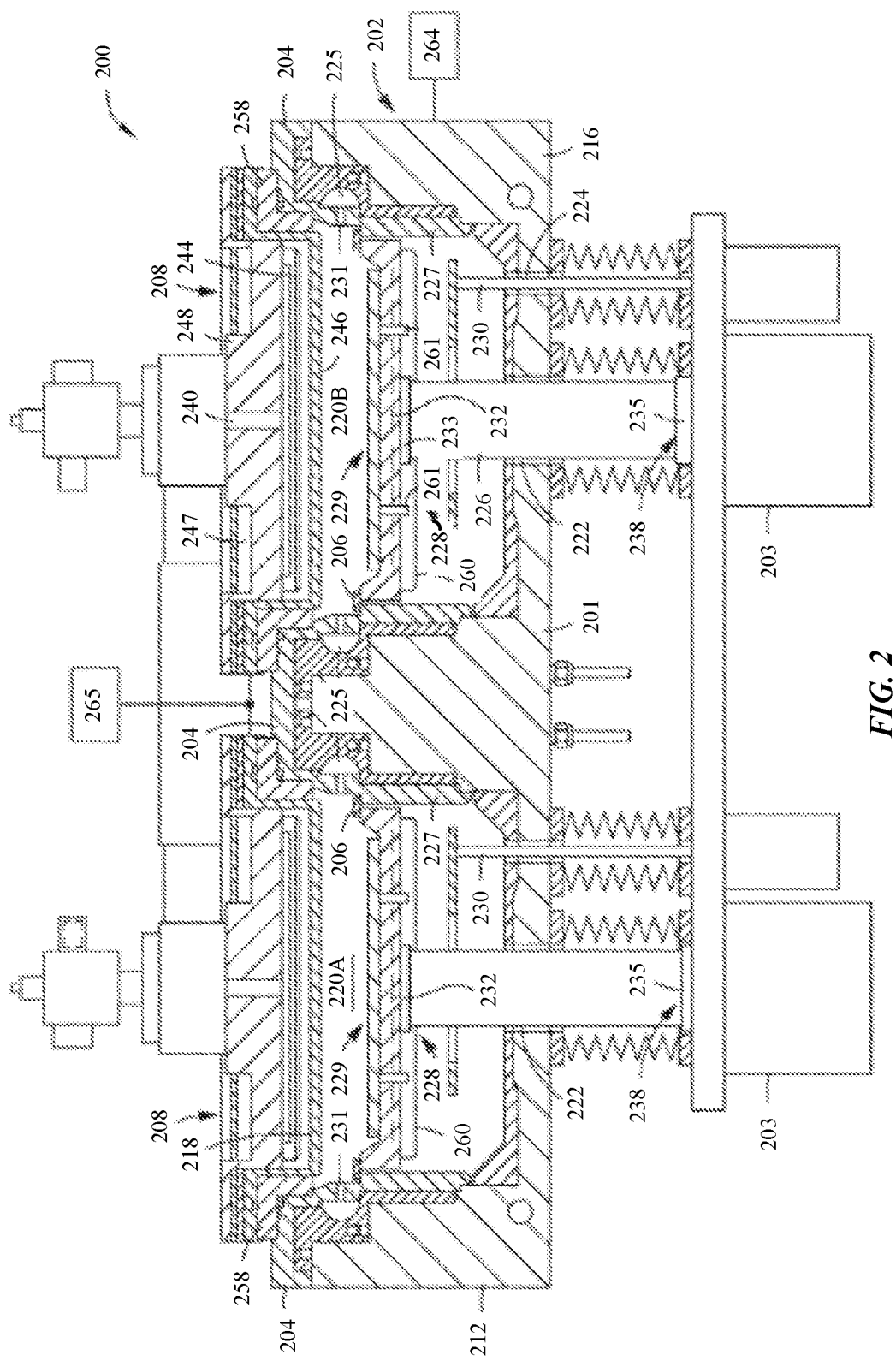
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
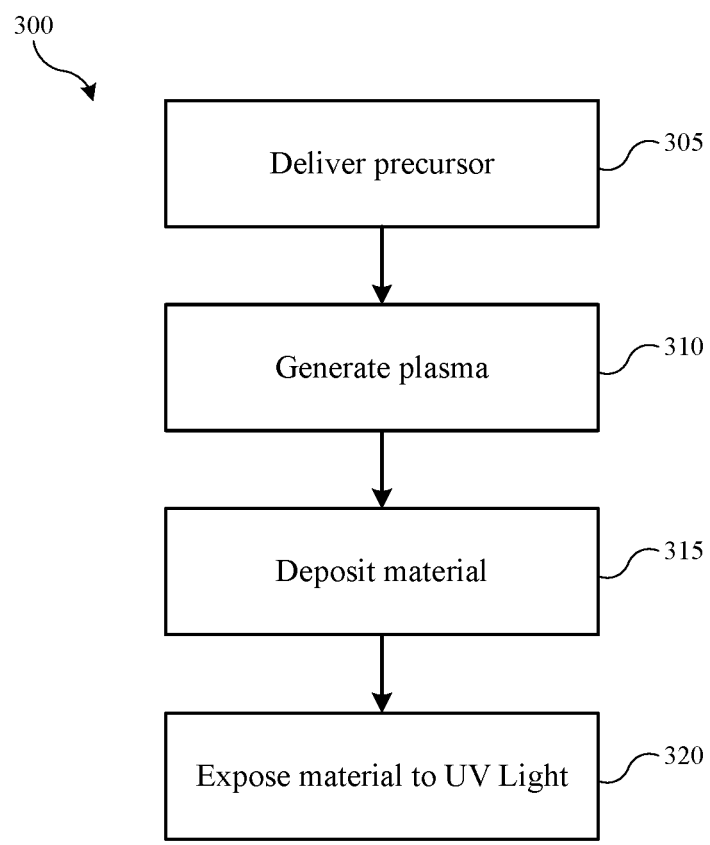
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology.

Method 300 may include plasma-enhanced chemical-vapor-deposition (PECVD) processing operations to form as-deposited, low-κ films. In some embodiments, the method may include optional operations prior to initiation of method 300, or the method may include additional operations after the deposition and UV treatment of the low-κ material. In additional embodiments, method 300, as shown in FIG. 3, may include flowing deposition precursors into a substrate processing region of a semiconductor processing chamber at operation 305. In embodiments, a substrate may be present in the substrate processing region of the semiconductor processing chamber as the deposition precursors flow into the chamber.

In some embodiments, the deposition precursors may include a silicon-and-carbon-containing precursor that has at least one vinyl group (i.e., —CH═CH$_2$ group). In additional embodiments, the silicon-containing precursor may have at least two vinyl groups. In still additional embodiments, the silicon-containing precursor may be characterized by Formula 1:

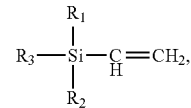

where $R_1$, $R_2$, and $R_3$, may include a $C_1$-$C_6$ alkyl group, or a $C_1$-$C_6$ alkoxy group, and where at least one of $R_1$, $R_2$, and $R_3$, is an alkoxy group.

In further embodiments, the silicon-and-carbon-containing precursor may be a silicon-carbon-and-oxygen-containing precursor. In embodiments, the silicon-carbon-and-oxygen-containing precursor may include Si—O bonds and Si—C bonds, and may further include linear branched silicon-containing precursors, cyclic silicon-containing precursors, or any number of additional silicon-containing precursors. In some embodiments the silicon-containing precursors may be characterized by certain molar ratios of carbon and/or oxygen to silicon. For example, in some embodiments a ratio of either carbon or oxygen to silicon may be greater than or about 1, and may be greater than or about 1.5, greater than or about 2, greater than or about 2.5, greater than or about 3, greater than or about 3.5, greater than or about 4, or more. By increasing the amount of carbon or oxygen relative to silicon, additional incorporation within the film of residual moieties or molecules may be increased. This may improve material properties, as well as lower a dielectric constant as will be described further below.

In still further embodiments, the silicon-and-carbon-containing precursor may include a silicon-oxygen-and-carbon-containing precursor. In embodiments, the silicon-oxygen-and-carbon-containing precursor may be characterized by a carbon-to-oxygen ratio that is less than or about 4:1, less than or about 3:1, less than or about 2:1, less than or about 4:3, or less. In embodiments, an increased amount of oxygen in the as-deposited low-κ film provided by the silicon-oxygen-and-carbon-containing precursor may increase the mechanical stability of the film. In additional embodiments, the amount of oxygen provided by the silicon-oxygen-and-carbon-containing precursor may be balanced relative to the amount of carbon in the low-κ film to maintain a low value of the film's dielectric constant (κ value).

In additional embodiments, the silicon-and-carbon-containing precursor may include a silicon-oxygen-and-carbon-containing precursor having a central silicon atom and at least one methyl group and at least one methoxy group bonded to the central silicon. In embodiments, these methylmethoxy-siloxane precursors may include DMDMOS, TMMOS, and MTMOS. In further embodiments, the silicon-containing precursor may include at least on silicon atom, at least one silicon-and-alkyl group bond, and at least one silicon-and-alkoxy group bond. In additional embodiments, the silicon-containing precursor may include a single silicon atom, and an alky group and alkoxy group that are both bonded to the silicon atom. In still additional embodiments, the silicon-containing precursor may include two or more silicon atoms. In still further embodiments, the silicon-containing precursor may have alkyl groups such as ethyl, propyl, butyl, pentyl, and/or hexyl groups, in addition to, or in lieu of, one or more methyl groups. In yet further embodiments, the silicon-containing precursors may have alkoxy groups such as ethoxy, propoxy, butoxy, pentoxy, and/or hexoxy groups, in addition to, or in lieu of, one or more methoxy groups. In embodiments, the silicon-containing precursor may include one or more of dimethyldimethoxysilane, bis(methyldimethoxysilyl)methane, methyltrimethoxysilane, isobutylmethyldimethoxysilane, tetramethyl-1,3-dimethoxydisiloxane, trimethylmethoxysilane, diethoxymethylsilane, octamethoxycyclotetrasiloxane, vinylmethyldimethoxysilane, isobutyltrimethoxysilane, 1,3-dimethyl-1,1,3,3-tetramethoxydisiloxane, 1,2-Bis(methyldimethoxysilyl)ethane, propylmethyldimethoxysilane, and 1,3,5,7-Tetramethyl-1,3,5,7-tetramethoxycyclotetrasiloxane.

Additional embodiments of the silicon-and-carbon-containing precursor may include those having Formula 2:

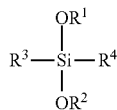

wherein in Formula 2,
$R^1$ may include a $C_1$-$C_6$ alkyl group, such as —$CH_3$, —$CH_2CH_3$, —$CH_2CH_2CH_3$, —$CH_2CH_2CH_2CH_3$, —$CH_2CH_2CH_2CH_2CH_3$, or —$CH_2CH_2CH_2CH_2CH_2CH_3$,
$R^2$ may include a $C_1$-$C_6$ alkyl group, such as —$CH_3$, —$CH_2CH_3$, —$CH_2CH_2CH_3$, —$CH_2CH_2CH_2CH_3$, —$CH_2CH_2CH_2CH_2CH_3$, or —$CH_2CH_2CH_2CH_2CH_2CH_3$,
$R^3$ may include —$OCH_3$, —$CH_3$, —H, —$(CH_2)_nCH_3$, —$O(CH_2)_nCH_3$, —$CH=CH_2$, —$CH_2$—$CH_2$—$(CH_2CH_3)_2$, or —$CH_2$—$CH(CH_3)_2$, where n=1 to 5, and
$R^4$ may include —$OCH_3$, —$CH_3$, —H, —$(CH_2)_nCH_3$, —$O(CH_2)_nCH_3$, —$CH=CH_2$, —$CH_2$—$CH_2$—$(CH_2CH_3)_2$, or —$CH_2$—$CH(CH_3)_2$, where n=1 to 5.

In some embodiments, the deposition precursors may further include molecular oxygen ($O_2$). In embodiments, the flow rate of the $O_2$ relative to the flow rate of the silicon-containing precursor may be maintained at a flow rate ratio that assists in forming a low-κ film with both a low dielectric constant (κ value) and high mechanical stability as reflected in film characteristics such as Young's modulus and hardness, among others. In embodiments, a flow rate ratio for the $O_2$ relative to the silicon-containing precursor may be greater than or about 2:1, greater than or about 2.5:1, greater than or about 3:1, greater than or about 3.5:1, greater than or about 4:1, greater than or about 4.5:1, greater than or about 5:1, or more.

In further embodiments, the deposition precursors may also include one or more carrier gases such as helium, argon, and nitrogen ($N_2$). Although the one or more carrier gases may be delivered with other deposition precursors, the carrier gases may be considered inert gases that do not react to form part of the as-deposited material.

In additional embodiments, a flow rate for the silicon-and-carbon-containing precursor may be greater than or about 2000 milligrams-per-minute (mgm), greater than or about 2100 mgm, greater than or about 2250 mgm, greater than or about 2500 mgm, greater than or about 2750 mgm, greater than or about 2900 mgm, greater than or about 3000 mgm, or more. In further embodiments, a flow rate for the $O_2$ may be greater than or about 120 sccm, greater than or about 130 sccm, greater than or about 140 sccm, greater than or about 150 sccm, greater than or about 200 sccm, greater than or about 250 sccm, greater than or about 300 sccm, greater than or about 350 sccm, greater than or about 400 sccm, greater than or about 450 sccm, greater than or about 500 sccm, or more. In still further embodiments, a flow rate for the one or more carrier gases may be greater than or about 1000 sccm, greater than or about 2000 sccm, greater than or about 3000 sccm, greater than or about 3000 sccm, greater than or about 4000 sccm, greater than or about 5000 sccm, or more. In further embodiments the flow rate of the combined deposition precursors may be greater than or about 1150 sccm, greater than or about 1500 sccm, greater than or about 2000 sccm, greater than or about 3000 sccm, greater than or about 4000 sccm, greater than or about 5000 sccm, or more.

In some embodiments, there has been observed that an excessive flow rate of $O_2$ relative to the silicon-and-carbon-containing precursor may increase the dielectric constant of the as-deposited material. It is believed that the excessive $O_2$ flow rate in these instances may cause an increased number of reactions between the oxygen and Si—H in the film to create hydroxyl (—OH) groups. In many embodiments, the dielectric constant of an as-deposited silicon-oxygen-and-carbon-containing material may be highly sensitive to the amount of hydroxyl groups in the film. A relatively small increase in the amount of hydroxyl groups in the material (e.g., an increase less than or about 1% as represented by the FTIR peak area ratio for the constituents of the material) may cause a relatively large increase in the film's dielectric constant (e.g., an increase greater than or about 10%). In some embodiments, the $O_2$ flow rate may be less than or about 600 sccm, less than or about 400 sccm, less than or about 200 sccm, less than or about 150 sccm, or less.

In additional embodiments, the deposition precursors that flow into the substrate processing region of the semiconductor processing chamber may alter the pressure in the chamber. In embodiments, the semiconductor substrate chamber pressure may be characterized by a pressure greater than or about 1 Torr, greater than or about 2 Torr, greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, or more during the formation of the as-deposited material.

Embodiments of method 300 may further include generating a deposition plasma from the deposition precursors at operation 310. In embodiments, the deposition plasma may be generated from the deposition precursors within the processing region, such as by providing RF power to the faceplate to generate a plasma within the substrate processing region of the semiconductor processing chamber. The deposition plasma may be generated at any of the frequencies previously described, and may be generated at a frequency less than 15 MHz (e.g., 13.56 MHz). Although higher frequency may be used, in some embodiments the lower frequency plasma generation may facilitate removal of carbon during processing, unlike higher plasma frequency operations.

Embodiments of method 300 may still further include depositing a silicon-and-carbon-containing material on a substrate at operation 315. In embodiments, the substrate is present in the substrate processing region of the semiconductor processing chamber, and the silicon-and-carbon-containing material is formed from deposition plasma effluents generated by the deposition plasma also present in the processing region. In some embodiments, the substrate may be characterized by a temperature less than or about 400° C., less than or about 390° C., less than or about 380° C., less than or about 370° C., less than or about 360° C., less than or about 350° C., less than or about 340° C., less than or about 330° C., less than or about 320° C., less than or about 310° C., less than or about 300° C., or less during the deposition.

In some embodiments, the deposition rate for the as-deposited material may exceed 500 Å/min, and may be deposited at a rate greater than or about 700 Å/min, greater than or about 1,000 Å/min, greater than or about 1,200 Å/min, greater than or about 1,400 Å/min, greater than or about 1,600 Å/min, greater than or about 1,800 Å/min, greater than or about 2,000 Å/min. In further embodiments, the as-deposited material may be deposited to a thickness of greater than or about 10 Å, greater than or about 50 Å, greater than or about 100 Å, greater than or about 250 Å, greater than or about 500 Å, greater than or about 1000 Å, or more. In still further embodiments, the as-deposited material may be deposited in two or more deposition and UV-treatment cycles to build up the final, UV-treated, low-κ film. In additional embodiments, the number of deposition and treatment cycles may be greater than or about three cycles, greater than or about five cycles, greater than or about ten cycles, greater than or about 15 cycles, greater than or about 20 cycles, greater than or about 30 cycles, greater than or about 40 cycles, greater than or about 50 cycles, or more.

In embodiments, the temperature of the substrate may be set to increase the amount of weakly-bonded hydrocarbon groups in the as-deposited material. In some embodiments, these hydrocarbon groups may be represented as —$C_xH_y$-, groups, where x is an integer greater than or about 1, and y is an integer greater than or about 2. In additional embodiments, x may be an integer greater than or about 2, and y may be an integer greater than or about 2. In further embodiments, the hydrocarbon groups may be ethyl groups, propyl groups, isopropyl groups, butyl groups, isobutyl groups, pentyl groups, isopentyl groups, cyclopentyl groups, hexyl groups, isohexyl groups, cyclohexyl groups, and phenyl groups, among other types of hydrocarbon groups. In further embodiments, the as-deposited silicon-and-carbon-containing material may include an amount of hydrocarbon groups that is greater than or about 5%, greater than or about 6%, greater than or about 7%, greater than or about 8%, greater than or about 8 at. %, greater than or about 9%, greater than or about 10% or more.

In some embodiments, the methyl groups in the as-deposited material may by more strongly-bonded in the material than other hydrocarbon groups. In these embodiments fewer methyl groups may be removed by the UV-treatment operation than other hydrocarbon groups. The retention of the methyl groups may maintain higher atomic percentages of carbon in the treated material, which in turn reduces the dielectric constant of the material. However, it is thought that the methyl groups have less of a destabilizing effect on the mechanical properties of the low-κ film than other hydrocarbon groups. Thus, selectively retaining the methyl groups over other hydrocarbon groups in the treated material may decrease the dielectric constant without as great a reduction in the mechanical stability of the low-κ film. In embodiments, as-deposited silicon-and-carbon-containing material may include methyl group incorporation that is greater than or about 2.5%, greater than or about 2.75%, greater than or about 3%, greater than or about 3.25%, greater than or about 3.5%, greater than or about 3.75%, greater than or about 4 at. %, greater than or about 4.25%, greater than or about 4.5%, greater than or about 4.75%, greater than or about 5%, or more. As depositions of the silicon-and-carbon-containing material are conducted at increased temperatures, the amount of hydrocarbon groups in the as-deposited material decreases. Higher deposition temperatures make the hydrocarbon groups more likely to outgas from the material as volatile organic compounds (VOCs) and react with the adjacent silicon and oxygen groups in the material. Thus embodiments of method 300 include depositing the silicon-and-carbon-containing material at decreased deposition temperatures where more hydrocarbon groups remain in the as-deposited material.

In further embodiments, the as-deposited silicon-and-carbon-containing material may include a significant atomic percentage of carbon. In embodiments, the as-deposited material may be characterized by an amount of carbon greater than or about 20 at. %, greater than or about 21 at. %, greater than or about 22 at. %, greater than or about 23 at. %, greater than or about 24 at. %, greater than or about 25 at. %, or more. The amount of as-deposited carbon will be reduced following the UV-treatment operation, but will not incur an atomic percentage reduction as large as the atomic percentage reduction of the hydrocarbon groups. The large amount of carbon in the initial deposition and after the UV treatment results in a lower dielectric constant in the final UV-treated, low-κ film.

Embodiments of the method 300 may further include exposing the as-deposited silicon-and-carbon-containing material to a UV treatment at operation 320. In some embodiments, the UV treatment may be performed in the semiconductor processing chamber used for the deposition of the low-κ material. In additional embodiments, the substrate with the as-deposited low-κ material may be transferred to another semiconductor processing chamber where the UV treatment operation is performed.

In embodiments, the UV treatment operation 320 may produce a exposed low-x material characterized by an increased porosity and lower dielectric constant (κ value) than the as-deposited material. In further embodiments the exposed low-κ material may be a silicon-and-carbon-containing material characterized by a porosity of greater than or about 15 vol. %, greater than or about 16 vol. %, greater than or about 17 vol. %, greater than or about 18 vol. %, greater than or about 19 vol. %, greater than or about 20 vol. %, or more. The increased porosity of the exposed low-κ material may decrease the material's dielectric constant to less than or about 3.0, less than or about 2.9, less than or about 2.8, less than or about 2.7, less than or about 2.6, or less.

In further embodiments, the increase in the porosity of the exposed low-κ material may be due to the reduction in weakly-bound hydrocarbon groups in the material. In embodiments, the exposed low-κ material may have an amount of hydrocarbon groups less than or about 3%, less than or about 2.75%, less than or about 2.5%, less than or about 2.25%, less than or about 2%, or less. In further embodiments, the reduction in amount of hydrocarbon groups between the as-deposited low-κ material and the UV-treated low-κ material may be greater than or about 25%, greater than or about 30%, greater than or about 40%, greater than or about 50%, greater than or about 60%, greater than or about 70%, greater than or about 80%, greater than or about 90%, greater than or about 100%, or more.

As noted above, the UV treatment operation may selectively remove hydrocarbon groups from the exposed low-κ material other than methyl groups. In embodiments, the exposed low-κ material may include methyl group incorporation that is less than or about 3.5 at. %, less than or about 3.25 at. %, less than or about 3 at. %, less than or about 2.75 at. %, less than or about 2.5 at. %, less than or about 2.25 at. %, less than or about 2 at. %, less than or about 1.75 at. %, less than or about 1.5 at. %, less than or about 1.25 at. %, less than or about 1 at. %, or less. In further embodiments, the reduction in amount of methyl incorporation between the as-deposited low-x material and the UV-treated low-κ material may be less than or about 50%, less than or about 45%, less than or about 30%, less than or about 25%, less than or about 20%, less than or about 15%, less than or about 10%, or less.

In further embodiments, the UV treatment operation may selectively remove hydrocarbon groups from the exposed low-κ material in greater relative amounts than the overall amount of carbon removed from the material. In embodiments, the exposed low-κ material may be characterized by an amount of carbon less than 20 at. %, less than or about 19 at. %, less than or about 18 at. %, less than or about 17 at. %, less than or about 16 at. %, less than or about 15 at. %, or less. In further embodiments, the reduction in amount of carbon between the as-deposited low-κ material and the UV-treated low-κ material may be less than or about 50%, less than or about 45%, less than or about 30%, less than or about 25%, less than or about 20%, less than or about 15%, less than or about 10%, or less. In embodiments, the selective removal of hydrocarbon groups over all carbon-containing constituents in the low-κ material may form a UV-treated low-κ material with a higher atomic percentage of carbon and lower dielectric constant than materials that start with lower percentages of the hydrocarbon groups.

The processing methods of the present technology include embodiments that produce UV-treated, low-κ films that are characterized by a high mechanical stability at high volume percentages of porosity. In embodiments, the UV-treated, low-κ films may be characterized by a Young's modulus of greater than or about 5 GPa, and may be characterized by a Young's modulus of greater than or about 7.5 GPa, greater than or about 10 GPa, greater than or about 15 GPa, greater than or about 16 GPa, greater than or about 17 GPa, greater than or about 18 GPa, greater than or about 19 GPa, greater than or about 20 GPa, or higher. In further embodiments, the UV-treated, low-κ films may be characterized by a hardness of greater than or about 2 GPa, greater than or about 3 GPa, greater than or about 4 GPa, greater than or about 4.5 GPa, greater than or about 5 GPa, greater than or about 5.5 GPa, greater than or about 6 GPa, greater than or about 6.5 GPa, greater than or about 7 GPa, greater than or about 7.5 GPa, greater than or about 8 GPa, greater than or about 10 GPa, or higher.

The ability of embodiments of the present technology to form UV-treated low-κ films with high porosity and high mechanical stability may be partly attributed to the amount of Si—C crosslinking in the films. In embodiments, the percentage of carbon atoms that are bonded to at least two silicon atoms to form Si—C—Si crosslinked bonds may be greater than 0.03%, greater than or about 0.06%, greater than or about 0.09%, greater than or about 0.12%, greater than or about 0.15%, greater than or about 0.18%, greater than or about 0.21%, greater than or about 0.24%, or more. These and other embodiments of the present technology provide a path to forming UV-treated, low-κ films from silicon-and-carbon-containing plasma effluents with higher porosity, lower dielectric constants, higher Young's moduli, and higher harnesses that can be produced with conventional plasma deposition and UV-treatment methods.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   flowing deposition precursors into a substrate processing region of a semiconductor processing chamber, wherein the deposition precursors comprise a silicon-and-carbon-containing precursor;
   generating a deposition plasma from the deposition precursors within the substrate processing region;
   depositing a silicon-and-carbon-containing material on the substrate from plasma effluents of the deposition plasma, wherein the as-deposited silicon-and-carbon-containing material is characterized by greater than 5% hydrocarbon groups, and wherein the as-deposited silicon- carbon- and oxygen-containing material is characterized by a methyl incorporation less than 4%; and exposing the deposited silicon-and-carbon-containing material to ultraviolet light, wherein the exposed silicon-and-carbon-containing material is characterized by less than 2% hydrocarbon groups.

2. The semiconductor processing method of claim 1, wherein the hydrocarbon groups comprise —CxHy, wherein x is an integer greater than 1, and y is an integer greater than 2.

3. The semiconductor processing method of claim 1, wherein the silicon-and-carbon-containing precursor is characterized by Formula 1:
wherein R1, R2, and R3, may include a C1-C6 alkyl group, or a C1-C6 alkoxy group, and
wherein at least one of R1, R2, and R3, is an alkoxy group.

4. The semiconductor processing method of claim 1, wherein as-deposited silicon-and-carbon-containing material is characterized by a carbon content greater than 20 at. %, and the exposed silicon- and carbon-containing material is characterized by a carbon content less than 15 at. %.

5. The semiconductor processing method of claim 1, wherein the exposed silicon- and carbon-containing material is characterized by a porosity of greater than 15 vol. %.

6. The semiconductor processing method of claim 1, wherein the exposed silicon-and-carbon-containing material is characterized by a dielectric constant less than 2.6.

7. The semiconductor processing method of claim 1, wherein the exposed silicon- and carbon-containing material is characterized by a Young's modulus of greater than 10 GPa, and a hardness of greater than 2 GPa.

8. A semiconductor processing method comprising:
flowing deposition precursors into a substrate processing region of a semiconductor processing chamber, wherein the deposition precursors comprise a silicon-carbon-and-oxygen-containing precursor;
generating a deposition plasma from the deposition precursors within the substrate processing region;
depositing a silicon-carbon-and-oxygen-containing material on a substrate from plasma effluents of the deposition plasma, wherein the substrate is characterized by a temperature of less than 300° C. during the deposition of the silicon- carbon- and oxygen-containing material, wherein the as-deposited silicon- carbon- and oxygen-containing material is characterized by a methyl incorporation less than 4%; and
exposing the as-deposited silicon- carbon- and oxygen-containing material to ultraviolet light, wherein the exposed silicon- carbon- and oxygen-containing material is characterized by a dielectric constant less than 2.6.

9. The semiconductor processing method of claim 8, wherein the as-deposited silicon-carbon-and-oxygen-containing material is characterized by greater than 5% hydrocarbon groups, and the exposed silicon-carbon-and-oxygen-containing material is characterized by less than 2% hydrocarbon groups.

10. The semiconductor processing method of claim 8, wherein the exposed silicon- carbon- and oxygen-containing material is characterized by a methyl incorporation of greater than 3.5%.

11. The semiconductor processing method of claim 8, wherein the silicon-carbon-and-oxygen-containing precursor comprises at least one vinyl group.

12. The semiconductor processing method of claim 8, wherein the as-deposited silicon-carbon-and-oxygen-containing material is characterized by a porosity of less than 10 vol. %.

13. The semiconductor processing method of claim 8, wherein the exposed silicon-carbon-and-oxygen-containing material is characterized by a Young's modulus of greater than 10 GPa, and a hardness of greater than 2 GPa.

14. A semiconductor processing method comprising:
flowing deposition precursors into a substrate processing region of a semiconductor processing chamber, wherein the deposition precursors comprise a silicon-carbon-and-oxygen-containing precursor with at least one vinyl group;
depositing a silicon-carbon-and-oxygen-containing material on a substrate in the semiconductor processing chamber, wherein the as-deposited silicon-carbon-and-oxygen-containing material is characterized by a porosity of less than 10 vol. %, wherein the as-deposited silicon-carbon-and-oxygen-containing material is characterized by a methyl incorporation less than 4%; and
exposing the as-deposited silicon-carbon-and-oxygen-containing material to ultraviolet light, wherein the exposed silicon-carbon-and-oxygen-containing material is characterized by a porosity of greater than 15 vol. %.

15. The semiconductor processing method of claim 14, wherein the as-deposited silicon-carbon-and-oxygen-containing material is deposited from deposition plasma effluents formed from a deposition plasma generated by the deposition precursors.

16. The semiconductor processing method of claim 14, wherein the exposed silicon-carbon-and-oxygen-containing material is characterized by a Si—C—Si bonds of greater than 0.1%.

17. The semiconductor processing method of claim 14, wherein the exposed silicon-carbon-and-oxygen-containing material is characterized by a Young's modulus of greater than 10 GPa, and a hardness of greater than 2 GPa.

18. The semiconductor processing method of claim 14, wherein the exposed silicon-carbon-and-oxygen-containing material is characterized by a methyl incorporation of greater than 3.5%.

19. The semiconductor processing method of claim 14, wherein the exposed silicon-carbon-and-oxygen-containing material is characterized by a dielectric constant less than 2.6.

20. The semiconductor processing method of claim 8, wherein the exposed silicon- carbon- and oxygen-containing material is characterized by Si—C—Si bonds of greater than 0.1%.

* * * * *